(12) United States Patent
Teo et al.

(10) Patent No.: US 10,622,960 B2
(45) Date of Patent: Apr. 14, 2020

(54) FILTERS WITH VIRTUAL INDUCTOR IMPLEMENTED USING NEGATIVE CAPACITOR

(71) Applicant: Mitsubishi Electric Research Laboratories, Inc., Cambridge, MA (US)

(72) Inventors: Koon Hoo Teo, Lexington, MA (US); Nadim Chowdhury, Cambridge, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 190 days.

(21) Appl. No.: 15/785,584

(22) Filed: Oct. 17, 2017

(65) Prior Publication Data

US 2019/0115898 A1    Apr. 18, 2019

(51) Int. Cl.

| H03H 7/01 | (2006.01) |
|---|---|
| H03H 7/06 | (2006.01) |
| H01G 4/33 | (2006.01) |
| H01L 49/02 | (2006.01) |
| H01G 4/12 | (2006.01) |
| H01G 4/40 | (2006.01) |
| H01G 4/38 | (2006.01) |
| H03H 1/00 | (2006.01) |
| H01G 7/06 | (2006.01) |

(52) U.S. Cl.
CPC .......... *H03H 7/175* (2013.01); *H01G 4/1218* (2013.01); *H01G 4/1236* (2013.01); *H01G 4/33* (2013.01); *H01G 4/40* (2013.01); *H01L 28/55* (2013.01); *H03H 7/06* (2013.01); *H01G 4/38* (2013.01); *H01G 7/06* (2013.01); *H03H 2001/0064* (2013.01)

(58) Field of Classification Search
CPC .. H03H 7/175; H03H 7/06; H03H 2001/0064; H01L 28/55; H01G 4/33; H01G 4/1218; H01G 4/40; H01G 4/1236; H01G 7/06; H01G 4/38
USPC .................................................. 333/175, 185
See application file for complete search history.

(56) References Cited

U.S. PATENT DOCUMENTS

| 6,754,338 B1 * | 6/2004 | Orr .......................... H04B 3/14 330/195 |
|---|---|---|
| 8,362,604 B2 | 1/2013 | Ionescu |
| 9,755,041 B2 | 9/2017 | Alam et al. |
| 2001/0026200 A1 * | 10/2001 | Rhodes ..................... H01P 1/20 333/167 |

(Continued)

OTHER PUBLICATIONS

Khan et al., "Negative capacitance in a ferroelectric capacitor," Nature Materials, Letters, Published Online: Dec. 15, 2014 | DOI: 10.1038/NMAT4148, vol. 14. pp. 182-186.

(Continued)

*Primary Examiner* — Rakesh B Patel
*Assistant Examiner* — Jorge L Salazar, Jr.
(74) *Attorney, Agent, or Firm* — Gennadiy Vinokur; James McAleenan; Hironori Tsukamoto

(57) ABSTRACT

A filter includes a circuit including a resistor, a positive capacitor, and a negative capacitor connected in series to accept the same current. The filter also includes an input terminal to accept an input voltage across the circuit and an output terminal to deliver an output voltage taken across the resistor or the positive capacitor.

15 Claims, 20 Drawing Sheets

(56) References Cited

U.S. PATENT DOCUMENTS

| | | | |
|---|---|---|---|
| 2015/0149678 A1* | 5/2015 | Kim | H04L 25/03885 710/302 |
| 2015/0318285 A1 | 11/2015 | Zhang | |
| 2016/0336312 A1* | 11/2016 | Yan | H01L 27/0711 |

OTHER PUBLICATIONS

Chowdhury et al., "Negative Capacitance Tunnel Field Effect Transistor: A Novel Device with Low Subthreshold Swing and High ON Current," 10.1149/05816.0001ecst ©The Electrochemical Society ECS Transactions, 58 (16) pp. 1-8 (2014).

Salahuddin et al., "Can the subthreshold swing in a classical FET be lowered below 60 mV/decade?," Electron Devices Meeting, 2008. IEDM 2008. IEEE International, conference: Dec. 15-17, 2008, Feb. 27, 2009, San Francisco, CA, USA.

Chowdhurry et al. "A low subthreshold swing tunneling field effect transistor for next generation low power CMOS applications," PhysicaE 74 (2015) 251-257.

Asif Islam et al., "Negative Capacitance in a Ferroelectric Capacitor," Nature Materials, vol. 14, No. 2, Dec. 15, 2014, pp. 182-186.

Anonymous., "RLC Circuit," Wikipedia, Apr. 15, 2015. pp. 1-4, Retrieved from the internet: https://en.wikipedia.org/w/index.php?title=RLC_circuit&%20oldid=684067571, retrieved on Jun. 28, 2018.

El Kamel et al., "Observation of Negative Capacitances in Metal Insulator Metal Devices Based on a-BaTi03:H," Applied Physics Letters, vol. 93, No. 4, Jul. 30, 2008. pp. 42904-1-42904-3.

Wakrim et al., "From MEMRISTOR to MEMImpedance Device," Applied Physics Letters, vol. 108, No. 5, Feb. 2016.

Tadros Morgane Raphael et al., "Observation of Negative Capacitances in Al/P(VDF-TrFE)/Si02/nSi Structures," Journal of Applied Physics, vol. 109, No. 1. Jan. 6, 2011. pp. 14501-1-14501-5.

Sayeef Salahuddin et al., "Use of Negative Capacitance to Provide Voltage Amplification for Low Power Nanoscale Devices," Nano Letters, vol. 8, No. 2, Feb. 2008. pp. 405-410.

* cited by examiner

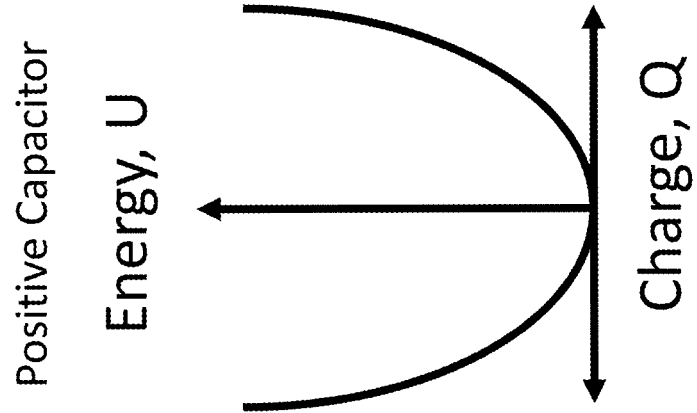

US 10,622,960 B2

FILTERS WITH VIRTUAL INDUCTOR IMPLEMENTED USING NEGATIVE CAPACITOR

TECHNICAL FIELD

The present invention relates generally to signal processing, and more particularly to filters for selectively filtering one or range of frequencies out of mixed frequencies of a signal.

BACKGROUND

It is sometimes desirable to have circuits capable of selectively filtering one frequency or range of frequencies out of a mix of different frequencies in a circuit. A circuit designed to perform this frequency selection is called a filter circuit, or simply a filter. Filters are used in a vast number of practical applications.

For example, a common need for filter circuits is in high-performance stereo systems, where certain ranges of audio frequencies need to be amplified or suppressed for best sound quality and power efficiency. For example, equalizers allow the amplitudes of several frequency ranges to be adjusted to suit the listener's taste and acoustic properties of the listening area. In contrast, crossover networks block certain ranges of frequencies from reaching speakers. Both equalizers and crossover networks are examples of filters, designed to accomplish filtering of certain frequencies.

Another practical application of filter circuits is in the "conditioning" of non-sinusoidal voltage waveforms in power circuits. Some electronic devices are sensitive to the presence of harmonics in the power supply voltage, and so require power conditioning for proper operation. If a distorted sine-wave voltage behaves like a series of harmonic waveforms added to the fundamental frequency, then it should be possible to construct a filter circuit that only allows the fundamental waveform frequency to pass through, blocking all (higher-frequency) harmonics.

Frequency-selective or filter circuits pass to the output only those input signals that are in a desired range of frequencies (called pass band). The amplitude of signals outside this range of frequencies (called stop band) is reduced (ideally reduced to zero). Typically, in these circuits, the input and output currents are kept to a small value and as such, the current transfer function is less important parameter than the voltage transfer function in the frequency domain.

FIG. 1 shows a conventional $1^{st}$ order passive low pass filter 100 which includes a resistor 101 and a capacitor 102 connected in series so that they can accept the same current. The input terminal 110 is connected across the whole circuit whereas the output terminal 120 is connected across the positive capacitor. The filter 100 is simple in implementation, but does not provide a gain greater than 0 dB and/or a rapid power roll off with a value more than 20 dB/decade around and beyond a cutoff frequency.

FIG. 2A shows an exemplar Gain vs Frequency curve 200 for a first order passive low pass filter 100. Here Gain is defined as 20 log(H(f)) wherein $H(f)=V_{out}/V_{in}(f)$. The value of Gain for a passive filter in the pass band 210 is either 0 dB or slightly less than that. A cut off frequency 230 is defined such that the gain at that point is −3 dB. The power roll off 220, i.e., the slope of Gain curve 200 in the stop band beyond cutoff frequency, is −20 dB/decade. A $1^{st}$ order low pass filter cannot provide a gain greater than 0 dB and a power roll off with a value more than −20 dB/decade around and beyond a cutoff frequency. In order to achieve higher power roll off in a passive low pass filter, two such low pass filters must be cascaded to make it a second order low pass filter. Also, in order to have a gain higher than 0 dB an active filter is needed with active elements like transistors, operational amplifiers.

FIG. 2B shows an exemplar Gain vs Frequency curve 205 for a $2^{nd}$ order passive low pass filter formed by cascading two first order passive low pass filters 100. The Gain is defined as 20 log(H(f)) wherein $H(f)=V_{out}(f)/V_{in}(f)$, and the value of Gain in the pass band 215 is always 0 dB or slightly less than that. A cut off frequency 235 is defined such that the gain at that point is −3 dB. The power roll off that is the slope of Gain curve in the stop band beyond cutoff frequency 225 is −40 dB/decade. One thing to be noticed is that the power roll off has been improved significantly in the $2^{nd}$ order filter. However, the gain is still 0 dB or less. In addition, the cascading $2^{nd}$ order passive low pass filter requires duplication of electric components of the first order passive low pass filter.

Another type of filters is RLC filters implemented based on combinations of resistors (R), inductors (L) and capacitors (C). The RLC filters are also known as passive filters, because they do not depend upon an external power supply and/or they do not contain active components such as transistors. The RLC filters can be configured to form a resonant circuit providing a high gain for a particular band of frequencies.

Inductors block high-frequency signals and conduct low-frequency signals, while capacitors do the reverse. A filter in which the signal passes through an inductor, or in which a capacitor provides a path to ground, presents less attenuation to low-frequency signals than high-frequency signals and is therefore a low-pass filter. If the signal passes through a capacitor, or has a path to ground through an inductor, then the filter presents less attenuation to high-frequency signals than low-frequency signals and therefore is a high-pass filter. Resistors on their own have no frequency-selective properties, but are added to inductors and capacitors to determine the time-constants of the circuit, and therefore the frequencies to which it responds.

The RLC filters can provide better power roll off than the $1^{st}$ order passive filter. However, inductors are very bulky due to their need to store energy in a form of current. To that end, fabricating/realizing an inductor in an integrated circuit (IC) in very difficult and consumes a lot of die area. In addition, the RLC filters also do not provide gain greater than 0 dB.

There is a pressing need to develop a compact and efficient circuit that can provide Gain in the pass band and higher roll of frequency without using any active elements, such as transistors and operational amplifier.

SUMMARY

Some embodiments disclose a filter formed by a capacitor connected in series with a resistor and a ferroelectric oxide capacitor operating in negative capacitance zone. According to simulations, the power rolls off a filter with a negative capacitor can be even higher than 40 dB/dec and the gain of the filter with a negative capacitor can be positive.

The negative capacitor differs from the positive capacitor in that the charge associated with a positive capacitor increases with the increase of the voltage across the positive capacitor, while the charge associated with a negative capacitor decreases with the increase of the voltage across the negative capacitor. Some embodiments are based on recognition that the voltage across the negative capacitor includes a term resembling the voltage across an inductor. After some simulations and/or experimentations, some embodiments confirm that the negative capacitor acts, in part, as an inductor. Hence, the negative capacitor can be potentially used in place of the inductor. Hence, the negative capacitor used in the circuits for the purpose of its inductive purposes is referred herein as virtual inductor.

Some embodiments are based on recognition that the negative capacitor is unstable in isolation, but can be stabilized if connected in series with a positive capacitor. Some embodiments are based on another realization that the positive capacitor plays its role in the filters to attenuate high-frequency signals. To that end, the same positive capacitor can play the dual role in the filter, i.e., to attenuate high-frequency signals and to stabilize the negative capacitor. In such a manner, the power rolls off a filter with virtual inductor as a negative capacitor can be increased without the need to use the actual inductor.

Some embodiments are based on recognition that typically it is impractical to connect two capacitors in series, because the joint capacitance of two positive capacitors connected in series is less than the sum of their individual capacitance. However, some embodiments are based on realization that when a negative capacitor is added in series with a positive capacitor the joint capacitance is enhanced. In such a manner, the gain of a filter with virtual inductor as a negative capacitor can be positive without the need to use any active elements, such as transistors and operational amplifier.

Accordingly, one embodiment discloses a filter having a circuit including a resistor, a positive capacitor, and a negative capacitor connected in series to accept the same current; an input terminal to accept an input voltage across the circuit; and an output terminal to deliver an output voltage taken across the resistor or the positive capacitor.

Another embodiment discloses a method for manufacturing a filter. The method includes providing a substrate; forming a first metal layer on the substrate; depositing a dielectric layer on the first metal layer; forming a second metal layer on the dielectric layer; depositing a ferroelectric oxide layer on the second metal layer; and forming a third metal layer on the ferroelectric oxide layer.

BRIEF DESCRIPTION OF THE DRAWINGS

FIG. 8A shows a plot of the Energy vs Charge characteristics of a positive capacitor according to some embodiments.

DETAILED DESCRIPTION

Figure 1:
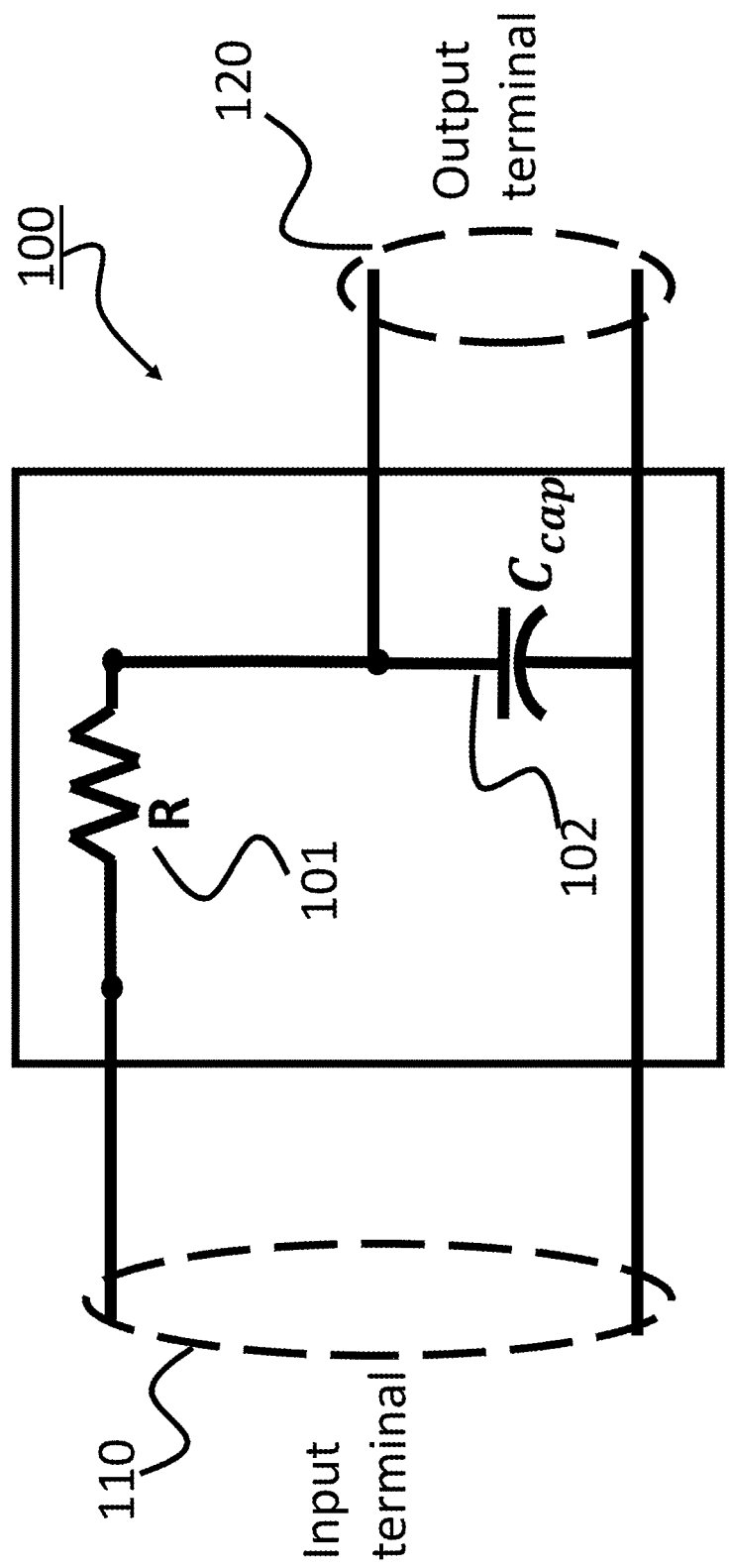
FIG. 1 shows a conventional 1st order passive low pass filter.
Figure 2A:
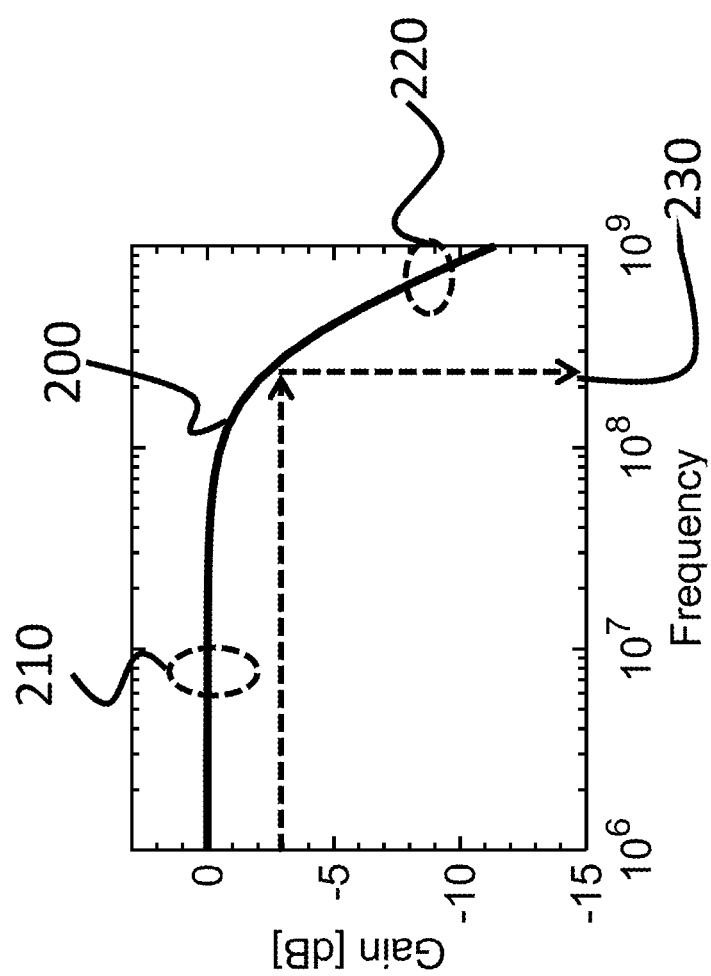
FIG. 2A shows an exemplar Gain vs Frequency curve for a first order passive low pass filter of FIG. 1.
Figure 2B:
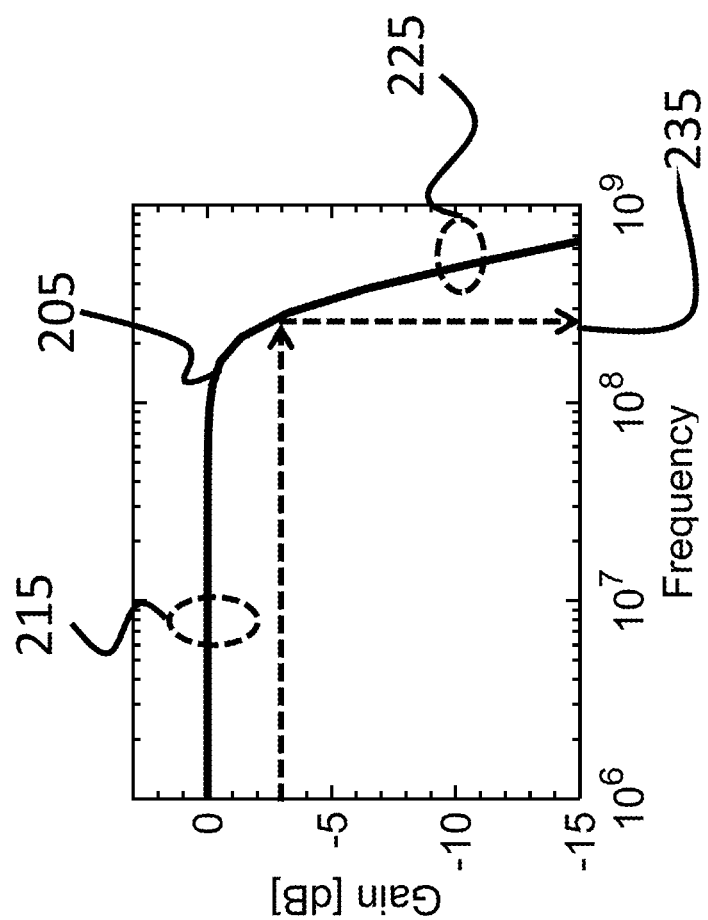
FIG. 2B shows an exemplar Gain vs Frequency curve for a 2nd order passive low pass filter formed by cascading two first order passive low pass filters of FIG. 1.
Figure 3A:
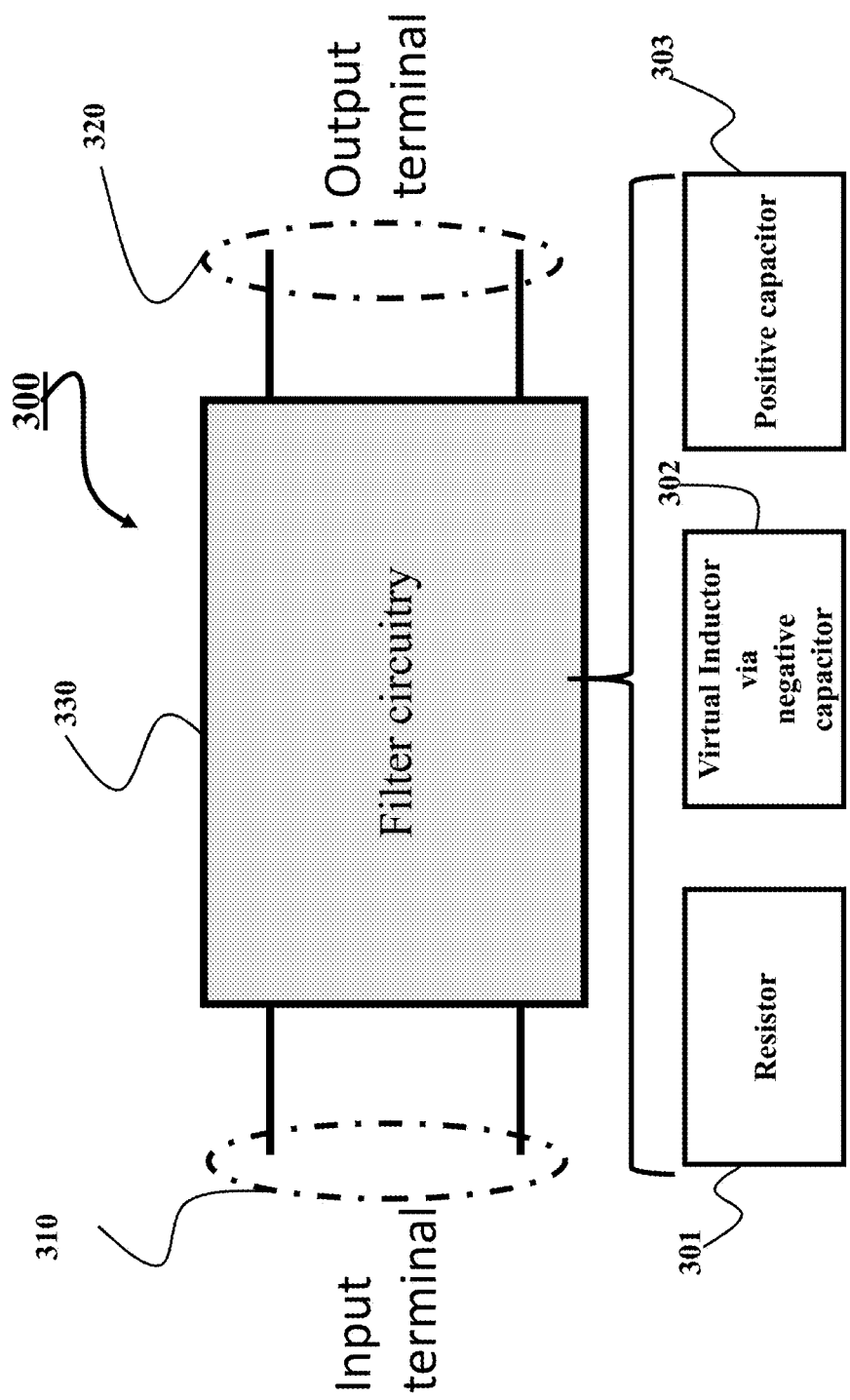
FIG. 3A shows a block diagram of a filter according to some embodiments.

FIG. 3A shows a block diagram of a filter 300 according to some embodiments. The filter 300 includes a circuitry 330 including a resistor 301, a positive capacitor 303, and a negative capacitor 302 connected in series to accept the same current. The order of connection of the resistor and the positive and the negative capacitors can vary. The filter 300 also includes an input terminal 310 to accept an input voltage across the circuit and an output terminal 330 to deliver an output voltage taken across the resistor or the positive capacitor. In some embodiments, the filter 300 includes only passive elements, such as resistors and capacitors. In some embodiments, the filter 300 includes only a combination of the resistor, the positive capacitor, and the negative capacitor.

Figure 3B:
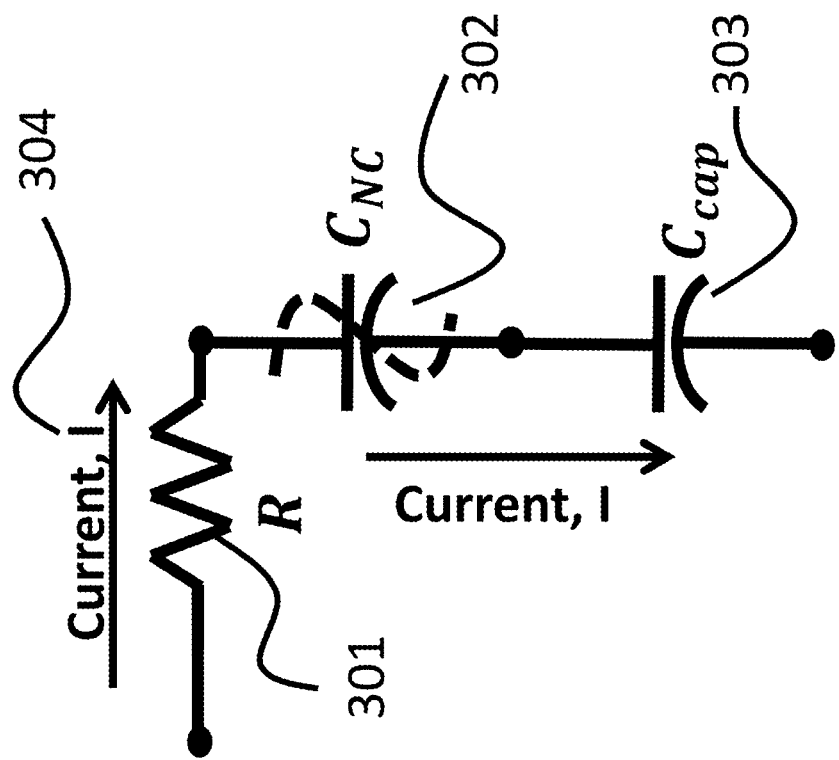
FIG. 3B shows a circuit diagram of a circuit of a filter according to one embodiment.

FIG. 3B shows a circuit diagram of a circuit of a filter according to one embodiment. The circuit includes a resistor 301, a capacitor 303 and a negative 302 capacitor. As shown on this diagram, all these elements 301, 302, and 303 are combined is such a way that once connected to a voltage source, the same current 304 pass through all the elements; this particular electrical connection is known as series connection and referred herein accordingly.

The power roll off the filter with a negative capacitor can be even higher than 40 dB/decade and the gain of the filter with a negative capacitor can be positive. The negative capacitor differs from the positive capacitor in that the charge associated with a positive capacitor increases with the increase of the voltage across the positive capacitor, while the charge associated with a negative capacitor decreases with the increase of the voltage across the negative capacitor.

Figure 4:
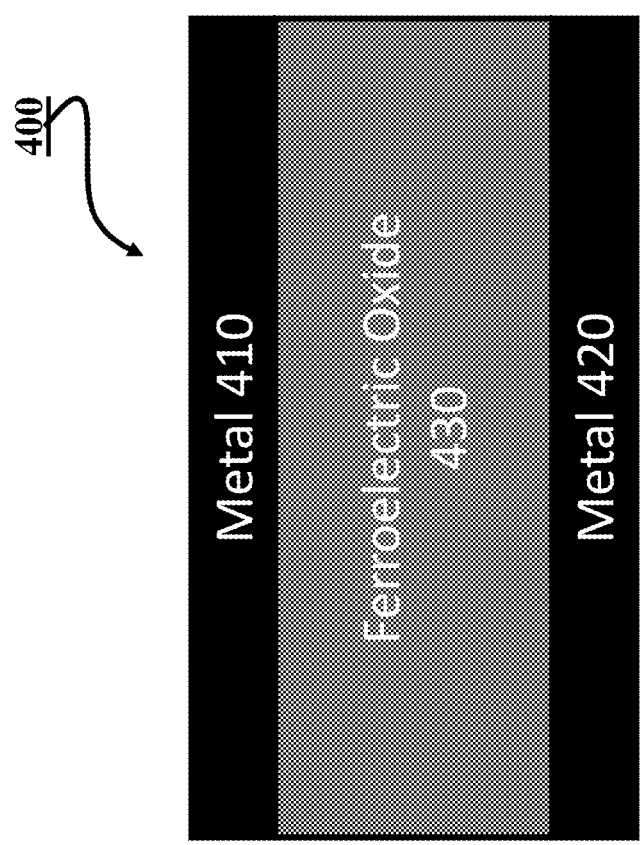
FIG. 4 shows a cross section of a negative capacitor according to some embodiments.

FIG. 4 shows a cross section of a negative capacitor 400 according to some embodiments. Those embodiments form the negative capacitor using a Ferroelectric Oxide (FEO) layer 430 sandwiched between two metal layers 410 and 420.

Some embodiments are based on recognition that the voltage across the negative capacitor includes a term resembling the voltage across an inductor. After some simulations and/or experimentations, some embodiments confirm that the negative capacitor acts, in part, as an inductor. Hence, the negative capacitor can be potentially used in place of the inductor. Hence, the negative capacitor used in the circuits for the purpose of its inductive purposes is referred herein as virtual inductor.

Figure 5:
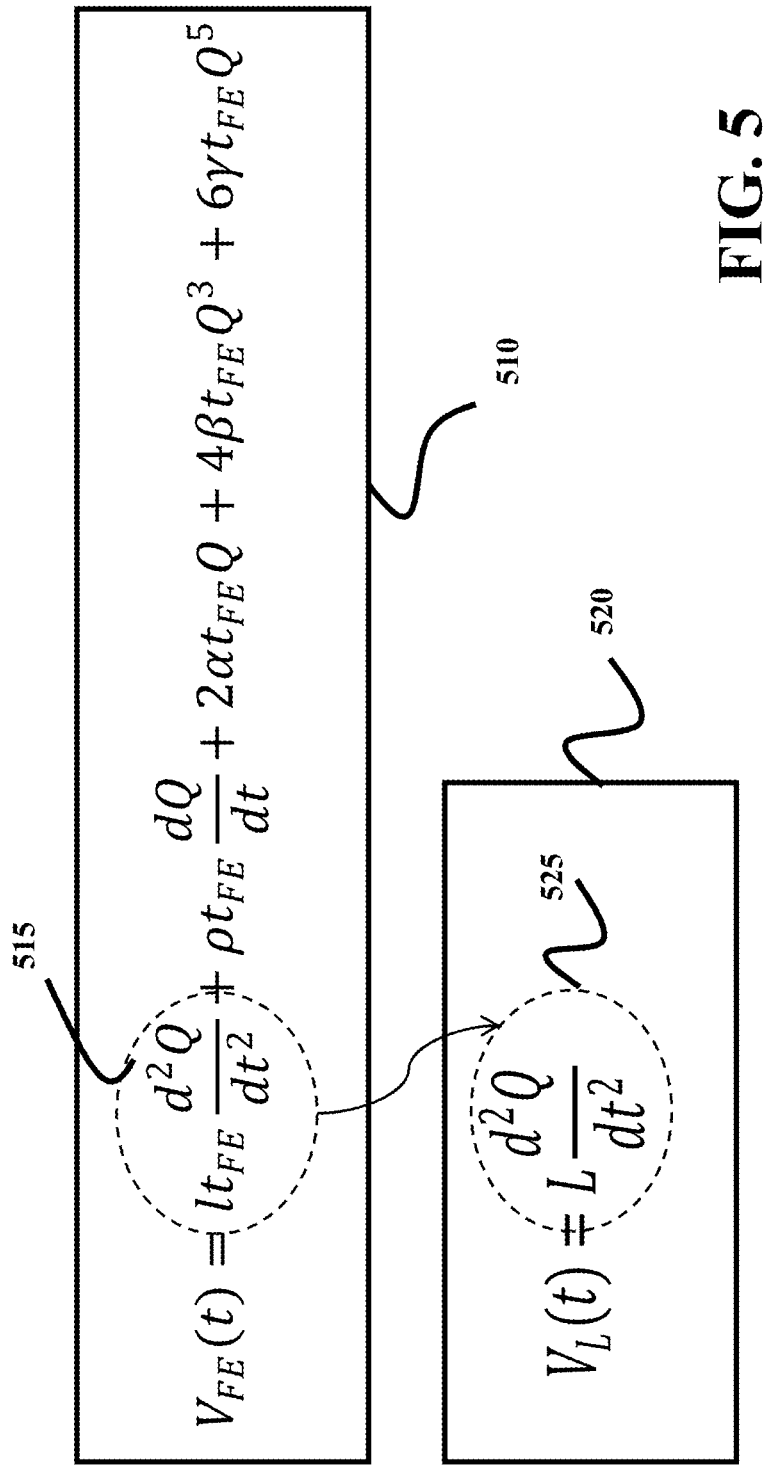
FIG. 5 shows a schematic of voltages across a negative capacitor and an inductor used by some embodiments.

FIG. 5 shows a schematic of voltages across a negative capacitor and an inductor used by some embodiments. The voltage 510 across the negative capacitor is $$V_{FE}(t) = lt_{FE}\frac{d^2Q}{dt^2} + \rho t_{FE}\frac{dQ}{dt} + 2\alpha t_{FE}Q + 4\beta t_{FE}Q^3 + 6\gamma t_{FE}Q^5, \quad (1)$$

where Q is the total charge, $t_{FE}$ is the thickness of ferroelectric oxide forming the negative capacitor, l, $\rho$, $\alpha$, $\beta$ and $\gamma$ are material constants of FE oxide.

The voltage 520 across an inductor is $$V_L(t) = L\frac{d^2Q}{dt^2}, \quad (2)$$

Some embodiments are based on realization that the first term 515 of Eqn. 1 is quite similar to the term 525 of Eqn. 2. To that end, it is realized that a negative capacitor has a built-in virtual inductance of value $lt_{FE}$.

Some embodiments are based on recognition that the negative capacitor is unstable in isolation, but can be stabilized if connected in series with a positive capacitor. Some embodiments are based on another realization that the positive capacitor plays its role in the filters to attenuate high-frequency signals. To that end, the same positive capacitor can play the dual role in the filter, i.e., to attenuate high-frequency signals and to stabilize the negative capacitor. In such a manner, the power roll off a filter with virtual inductor as a negative capacitor can be increased without the need to use the actual inductor.

Figure 6:
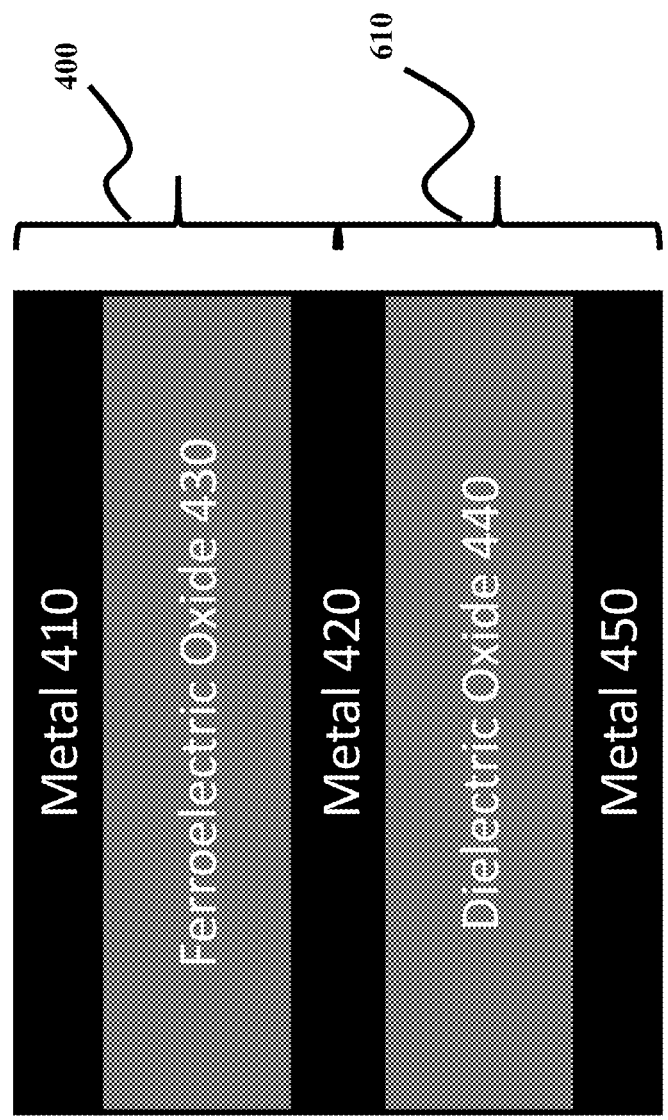
FIG. 6 shows a schematic of a negative capacitor stabilized with help of a positive capacitor according to one embodiment.

FIG. 6 shows a schematic of a negative capacitor 400 stabilized with help of a positive capacitor 610 according to one embodiment. In this embodiment, the positive capacitor 610 is formed using dielectric oxide layer 440 sandwiched between two metal layers 420 and 450.

Figure 7A:
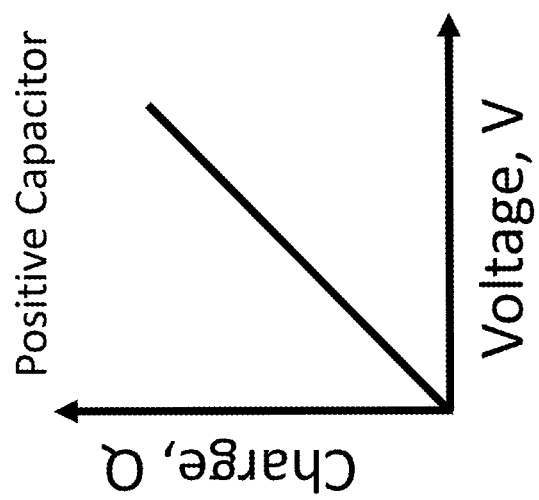
FIG. 7A shows a plot of the charge voltage characteristics of a positive capacitor formed according to some embodiments.

FIG. 7A shows a plot of the charge voltage characteristics of a positive capacitor formed by a layer 440 according to some embodiments. This plot demonstrates that the charge associated with a positive capacitor increases with the increase of the voltage across the positive capacitor.

Figure 7B:
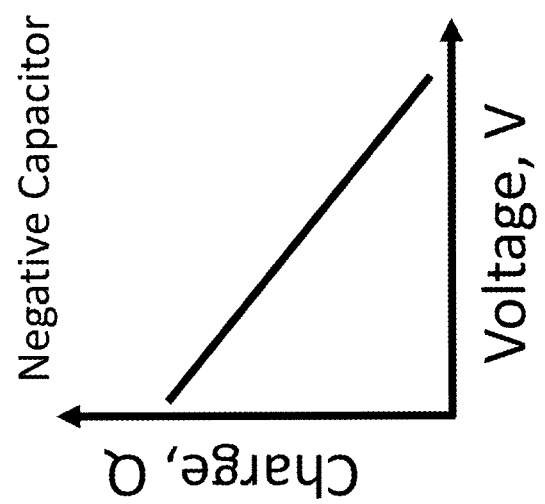
FIG. 7B shows a plot of the charge voltage characteristics of a negative capacitor according to some embodiments.

FIG. 7B shows a plot of the charge voltage characteristics of a negative capacitor formed by the FEO layer 430 according to some embodiments. This plot demonstrates that the charge associated with a negative capacitor goes down with the increase of the voltage across the negative capacitor.

FIG. 8A shows a plot of the Energy vs Charge characteristics of a positive capacitor formed by a layer 440 according to some embodiments. This plot has a "V" shaped Energy vs Charge curve (U vs Q). The curvature of U vs Q curve gives the value of capacitance.

Figure 8B:
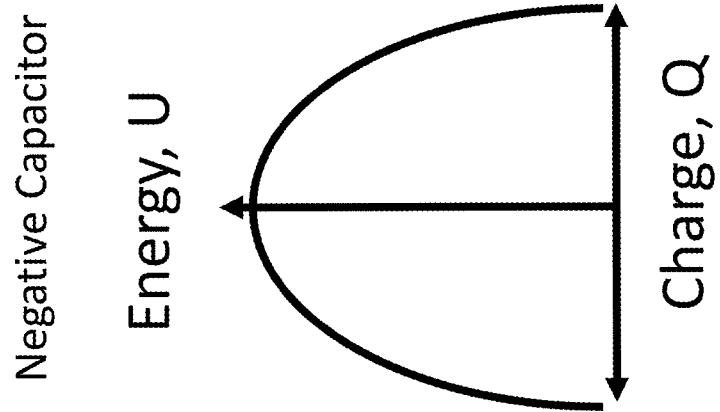
FIG. 8B shows a plot of the Energy vs Charge characteristics of a negative capacitor employed by some embodiments.

FIG. 8B shows a plot of the Energy vs Charge characteristics of a negative capacitor employed by some embodiments. This plot has an inverted/upside down "V" shaped Energy vs Charge curve (U vs Q). The curvature of U vs Q curve gives the value of capacitance. However, such a negative capacitor is unstable without additional assistance and configuration.

Figure 9A:
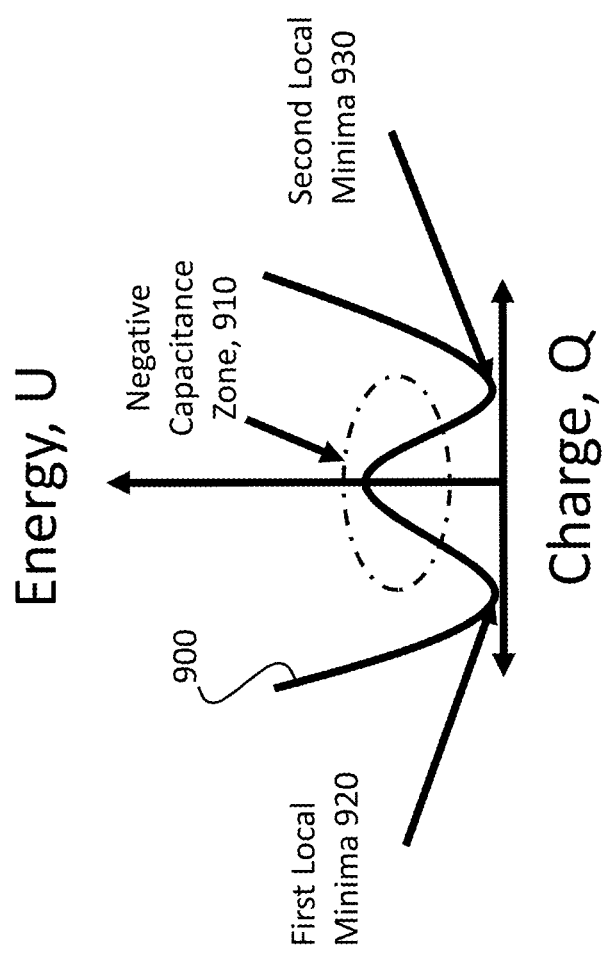
FIG. 9A shows a plot of the energy landscape curve of a ferroelectric oxide material used by some embodiments.

FIG. 9A shows a plot of the energy landscape curve 300 of a ferroelectric oxide material as a function of charge used in FEO layer 430 according to some embodiments. The energy landscape curve of a FEO material has "W" shape 900. This curve 900 around zero charge value has negative curvature giving rise to negative capacitance, referred herein as a "negative capacitance zone". Normally a FEO material cannot stay in this zone because it has higher energy and end up being either of the two local minima 920 and 930. However, adding a capacitor 610 in series to have the same charge can make the ferroelectric oxide stable in negative capacitance zone. This is because adding a normal capacitor makes the overall energy of the system lower.

To that end, some embodiments select the thickness of the FEO layer 430 as a function of charge of the positive capacitor. For example, one embodiment selects the thickness of the FEO layer to be less than a critical thickness $T_c$ determined based on $$T_c = 1/(2\alpha C_{cap}),$$

wherein $\alpha$ is a material based parameter the material of the FEO layer, $C_{cap}$ is the capacitance of the positive capacitor.

Figure 9B:
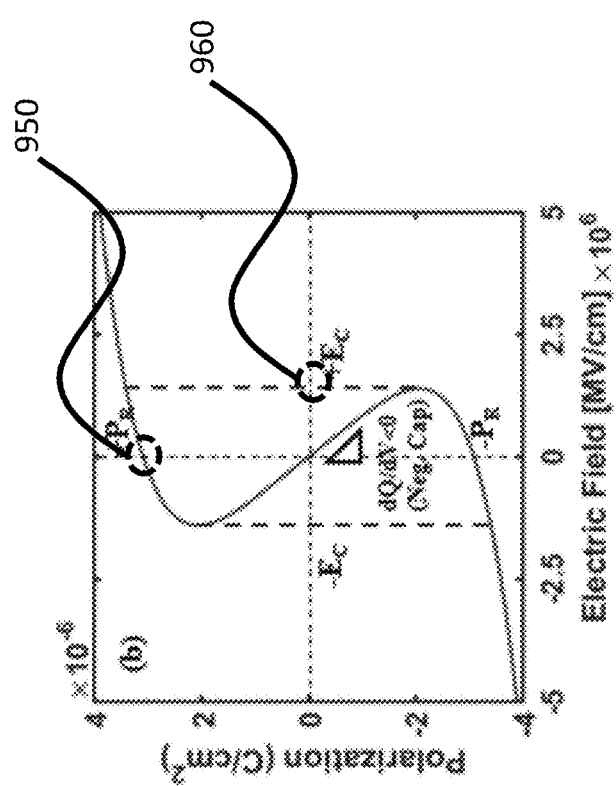
FIG. 9B shows a plot of polarization vs electric field used to calculate material based parameter a according to some embodiment of the invention.

FIG. 9B shows the measured polarization vs electric field characteristics of ferroelectric oxide. The electric labeled in this figure as 960 is known as coercive electric field ($E_c$) and the polarization at zero electric field labeled by 950 is known as remnant polarization $P_R$. Once $P_R$ and $E_C$ are known from the P-E measurement, one can calculate a by using the following equation, $$\alpha = -\frac{\sqrt{3}}{4} \times \frac{E_C}{P_R}.$$

Some embodiments are based on recognition that typically it is impractical to connect two capacitors in series, because the joint capacitance of two positive capacitors connected in series is less than the sum of their individual capacitance. However, some embodiments are based on realization that However, some embodiments are based on realization that, when a negative capacitor is added in series with a positive capacitor the joint capacitance is enhanced. The amplification of the input voltage in the invented filter can be understood from Kirchhoff's Voltage Law (KVL), according to this law, $$V_{input} - V_R - V_{output} - V_{FE} = 0;$$

Here, $V_R$ is the voltage across the resistor and $V_{FE}$ is the voltage across the negative capacitor. In most applications $V_R \sim 0$ and $$V_{FE} = -\frac{\text{Charge}}{|C_{FE}|};$$

using these values we get, $$V_{output} = V_{input} + \frac{\text{Charge}}{|C_{FE}|}.$$

Therefore, $V_{output} > V_{input}$, since for a positive applied voltage charge is positive.

In such a manner, the gain of a filter with virtual inductor as a negative capacitor can be positive without the need to use any active elements, such as transistors and operational amplifier.

Figure 10:
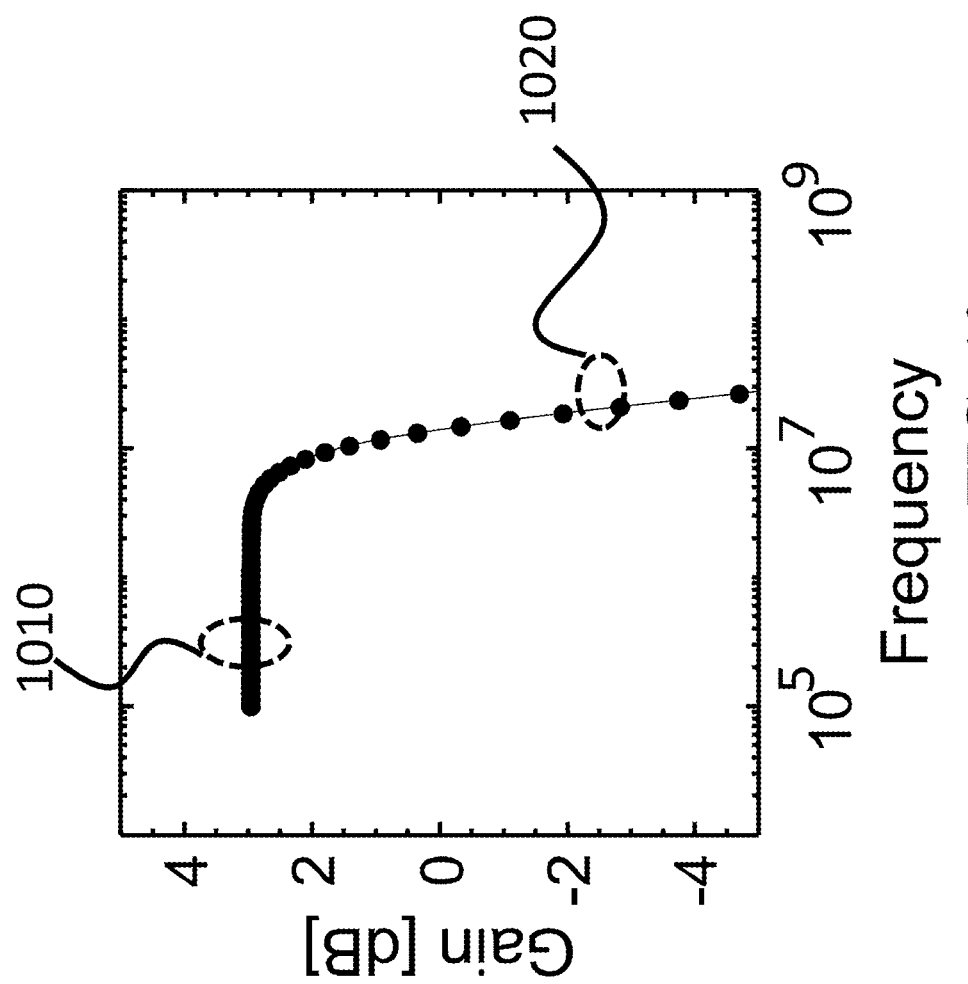
FIG. 10 shows a plot of Gain vs Frequency characteristics of a filter with virtual inductor according to some embodiments.

FIG. 10 shows a plot of Gain vs Frequency characteristics a filter with virtual inductor according to some embodiments. Here Gain is defined as 20 log(H(f)) wherein H(f)= $V_{out}(f)/V_{in}(f)$. As is evident from the figure, the value of Gain for the filter in the pass band 1010 is +3 dB which is greater than 0 dB. And power roll off that is the slope of Gain curve in the stop band beyond cutoff frequency 1020 is greater than −40 dB/decade.

A frequency of interest can be defined as a critical frequency fc at which the Gain is 0 db. The said critical frequency can be thought of a frequency beyond which the negative capacitance effect is nullified. As shown in FIG. 10 the gain G(ω) is a function almost constant at the low frequency regime and decreases sharply at the higher frequency. An expression for gain is $$\text{Gain}(\omega) = 20 \times \log\left(\frac{1}{C_{Cap}\rho t_{FE}\sqrt{\omega^2 + \left(\frac{2\alpha}{\rho} + \frac{1}{\rho t_{FE}C_{Cap}} - \frac{\omega^2 l}{\rho}\right)^2}}\right).$$

An expression that relates fc with the circuit parameters and the material based parameter of FEO is $$f_C = \frac{1}{2\pi} \times \sqrt{\frac{-A + \sqrt{A^2 - 4B}}{2}},$$

where $$A = \frac{(t_{fe}\rho)^2}{(t_{fe}l)^2} - \frac{4\alpha}{l} - \frac{2}{lC_{Cap}t_{fe}}$$

and $$B = \frac{4\alpha^2}{l^2} + \frac{4\alpha}{l^2 C_{Cap}t_{fe}}.$$

As long as the required the cutoff frequency of the filter is less than that of the critical frequency, the negative capacitance can provide positive Gain.

A second order filter can be implemented by having an inductor in series with the first order filter, however having an inductor in an integrated circuit is expensive as mentioned earlier. In addition to power roll of and gains benefits of the filter with the virtual inductor implemented via negative capacitor, such a filter according to various embodiments is more compact than the filter with actual inductor and can be advantageously implemented as an is an integrated circuit formed on a substrate.

Figure 11:
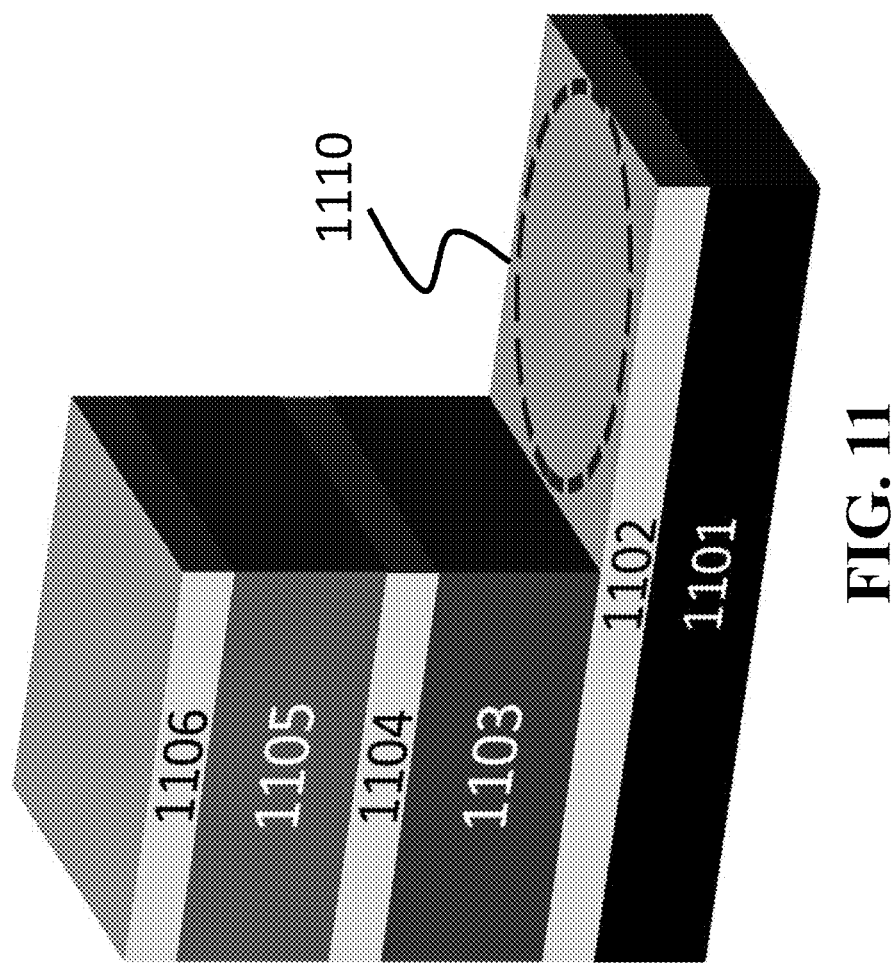
FIG. 11 shows a 3-D schematic of the filter in semiconductor platform according to one embodiment.

FIG. 11 shows a 3-D schematic of the filter in semiconductor platform according to one embodiment. The filter includes a negative capacitor which is formed by a ferroelectric oxide layer 1105 sandwiched between two metal layers 1104, 1106; a positive capacitor formed by a dielectric layer 1103 sandwiched between two metal layers 1102 and 1104; and a resistor formed by pattering the extended portion labeled 1110 of the metal 1102. Here, the negative capacitor, positive capacitor and the resistor are in series combination. For example, the dielectric layer 1103 can include one or combination of Al2O3, SixOy, SixNy, SixOyNz, Teflon, HfO2, or any other dielectric with a dielectric constant below 200. For example, the substrate can include one or combination of silicon (Si), silicon carbide (SiC), diamond, and gallium nitride (GaN).

Depending on arrangement of the output terminal, the filter of some embodiments can for a low-pass filter, a high-pass filter, and a band-pass filter that can be also configured to form a resonant circuit.

Figure 12A:
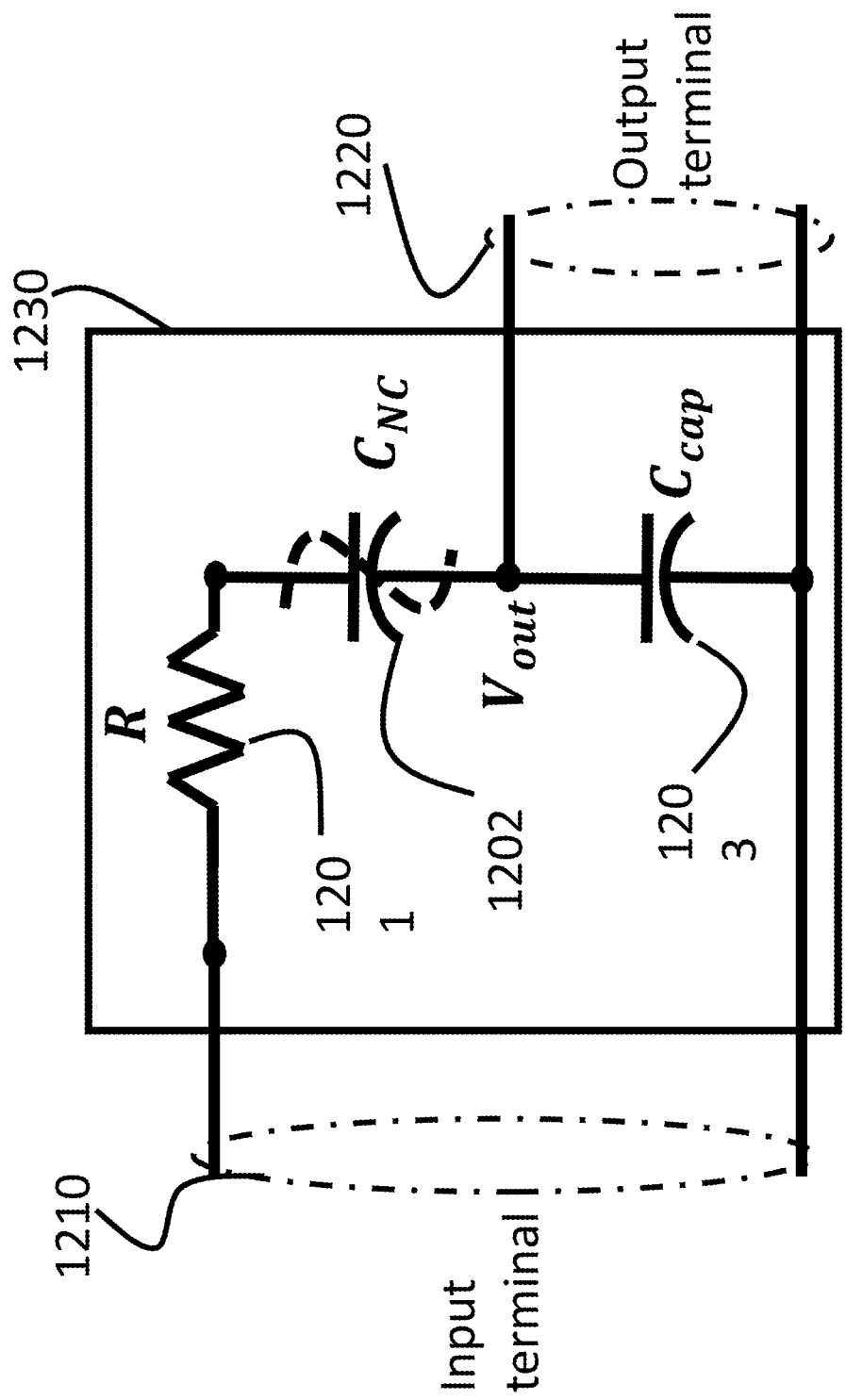
FIG. 12A shows a schematic of a circuit of a low pass according to one embodiment.

FIG. 12A shows a schematic of a circuit 1230 of a low pass according to one embodiment. In this embodiment, the filter built with a series combination of a resistor 1201, a capacitor 1203 and a negative capacitor 1202 wherein the input terminal 1210 is taken across the whole series combination and output terminal 1220 is taken across the positive capacitor 1203. Such combination of input and output terminals would provide low pass filter operation, which presents less attenuation to low-frequency signals than high-frequency signals. Specifically, with the output voltage taken across the positive capacitor, such that the filter is a passive low-pass filter with the output voltage greater than the input voltage in a pass band and a power roll off greater than 20 dB per decade.

Figure 12B:
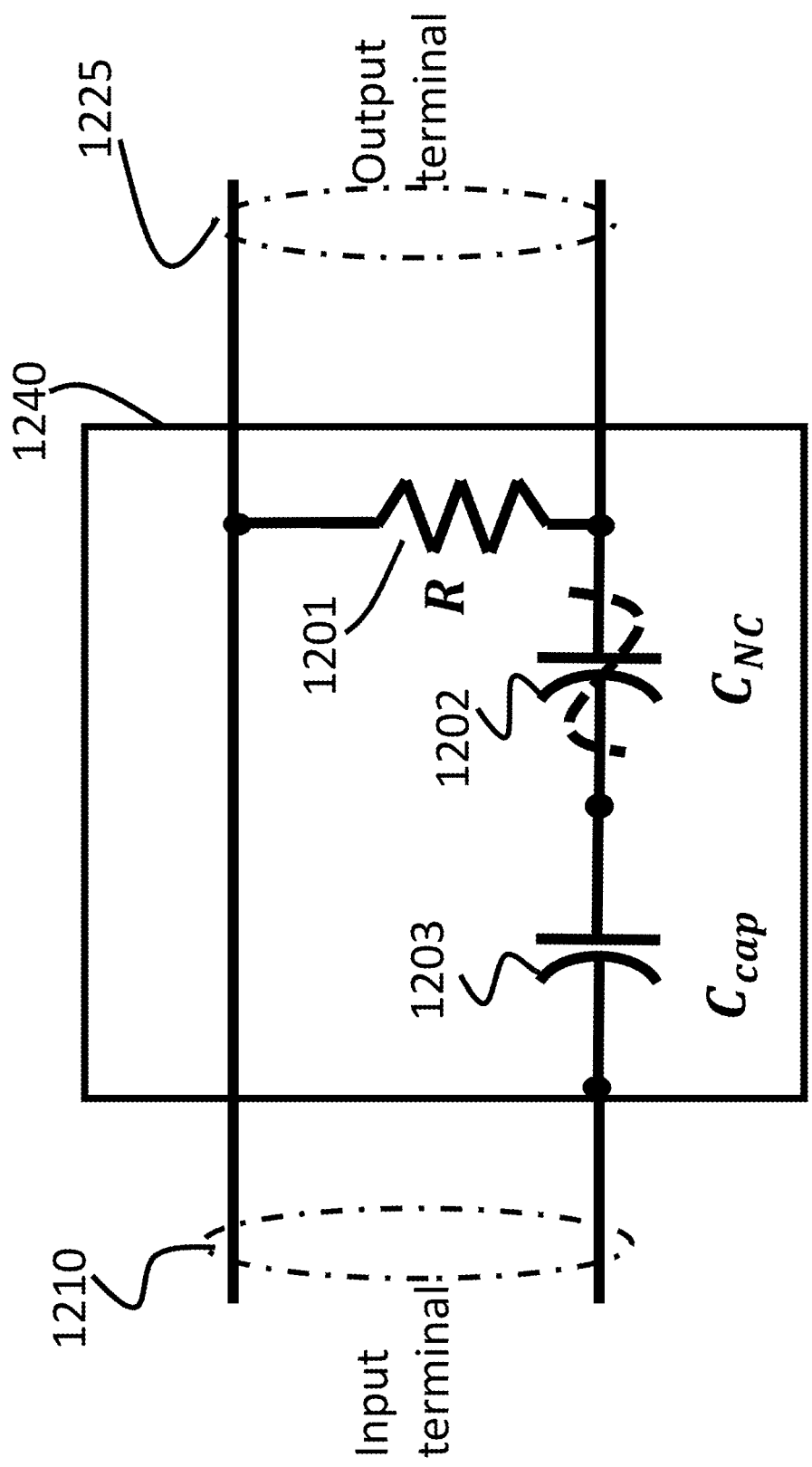
FIG. 12B shows a schematic of a circuit of a high pass filter according to one embodiment.

FIG. 12B shows a schematic a circuit 1240 of a high pass filter according to one embodiment. In this embodiment, the filter built with a series combination of a resistor 1201, a capacitor 1203, and a negative capacitor 1202, where the input terminal 1210 is across the whole circuit and the output terminal 1225 is across the resistor. Specifically, with the output voltage is taken across the resistor, such that the filter is a passive high-pass filter with the output voltage greater than the input voltage in a pass band and a power roll off greater than 20 dB per decade. In some implementations, this circuit behaves like a high pass filter and is capable of providing gain in the pass band and would yield more than −40 dB/decade power roll off.

Figure 12C:
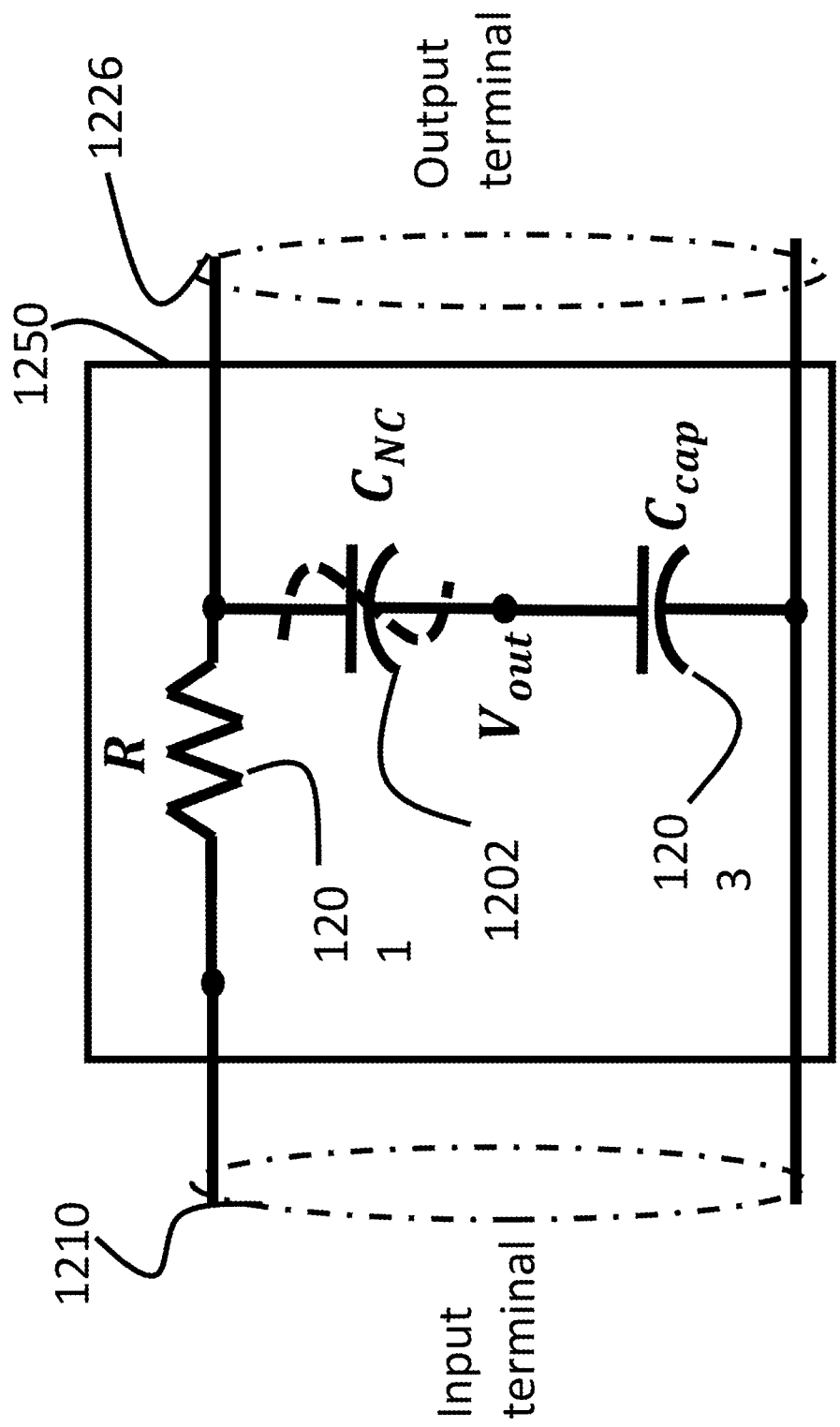
FIG. 12C shows a schematic of a circuit of a resonant circuit according to one embodiment

FIG. 12C shows a schematic of a circuit 1250 of a resonant circuit according to one embodiment. In this embodiment, the filter built with a series combination of a resistor 1201, a capacitor 1203, and a negative capacitor 1202, where the input terminal 1210 is across the whole circuit and the output terminal 1226 is across the capacitor and the negative capacitor. When the circuit operates at the resonant frequency the reactance due to the virtual inductor coining from the negative capacitor cancels out the reactance of the positive capacitor and a high current flows through the circuit, in this way a series resonance is achieved.

Figure 13:
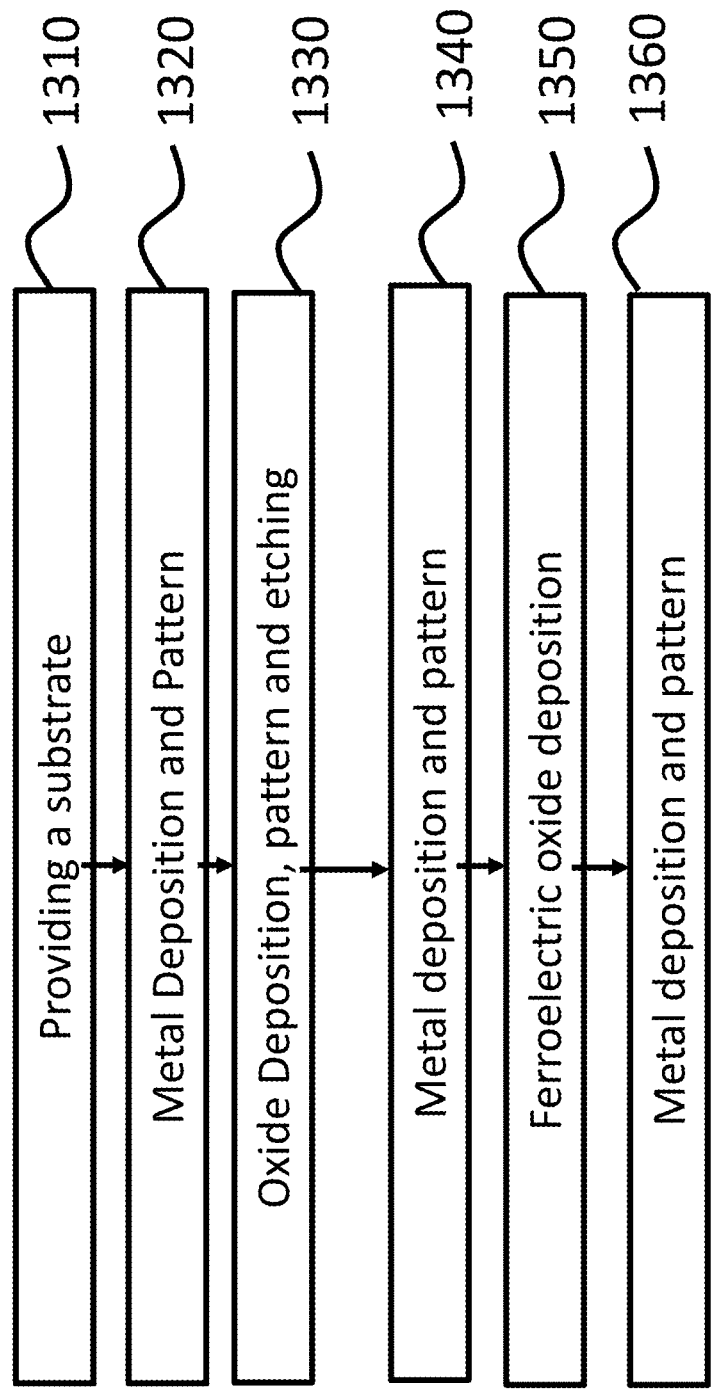
FIG. 13 shows the block diagram of a method for fabricating a filter as a semiconductor device according to some embodiments.

FIG. 13 shows the block diagram of a method for fabricating a semiconductor device according to some embodiments. The method includes providing substrate 1310, here the substrate includes but not limited to silicon (Si), silicon carbide (SiC), diamond, gallium nitride (GaN) and so on. Further the method includes the formation 1320 of a first metal layer for the resistor and positive capacitor. The formation of this metal layer can be done by Lithography→Metal Deposition→Lift-off and/or Metal deposition→Lithography→Etching. Here the lithography could be performed using, including but not limited to photo-lithography, electron-beam lithography. Metal deposition can be done using one or combination of an ebeam deposition, a joule evaporation, a chemical vapor deposition and a sputtering process.

The method also includes 1330, deposition of dielectric layer on the first metal layer to form positive capacitor. Then etch away the dielectric layer from the extended region of the first metal layer so that an electrical contact can be made while doing measurements. The method further includes deposition 1340 of a second metal layer on the dielectric layer and deposition 1350 of ferroelectric oxide layer on the second metal layer and deposition 1360 of the third metal layer on the ferroelectric oxide layer to form negative capacitor. The extended portion of the first metal layer and/or the third metal layer can be patterned to form a resistor. Also, in some implementations, the first and third metal serves as the input terminal and second and third mental serves as the output terminal.

In some implementations, the method includes etching away the ferroelectric oxide layer from the extended region so that an electrical contact can be made with metal the first metal layer while doing measurement. The dielectric and ferroelectric oxide layers can be deposited using one or combination of an atomic layer deposition (ALD), a chemical vapor deposition (CVD), Metal-Organic Chemical Vapor Deposition (MOCVD), a Molecular Beam Epitaxy (MBE), a Metal Organic Vapor Phase Epitaxy (MOVPE), a Plasma Enhanced Chemical Vapor Deposition (PECVD), and a microwave plasma deposition.

Although the invention has been described by way of examples of preferred embodiments, it is to be understood that various other adaptations and modifications can be made within the spirit and scope of the invention. Therefore, it is the objective of the appended claims to cover all such variations and modifications as come within the true spirit and scope of the invention.

We claim:
1. A filter, comprising:
a circuit including a resistor, a positive capacitor, and a negative capacitor connected in series to accept same current, wherein the negative capacitor is formed using a Ferroelectric Oxide (FEO) layer sandwiched between two metal layers, wherein the FEO layer includes one or combination of Barium titanate ($BaTiO_3$), Strontium titanate (SrTiO3), Hafnium Zirconium Oxide (HfZrOx) and Doped Hafnium oxide;
an input terminal to accept an input voltage across the circuit; and
an output terminal to deliver an output voltage taken across the resistor or the positive capacitor.
2. The filter of claim 1, wherein the resistor is formed by a transistor operating in a triode region.
3. The filter of claim 1, wherein a thickness of the FEO layer is less than a critical thickness $T_c$ determined based on

$$T_c = 1/(2\alpha C_{cap}),$$

wherein $\alpha$ is a material based parameter of the material of the FEO layer, $C_{cap}$ is the capacitance of the positive capacitor.
4. The filter of claim 1, wherein a material of the FEO layer is doped.
5. The filter of claim 1, wherein the output voltage is taken across the positive capacitor, such that the filter is a passive low-pass filter with the output voltage greater than the input voltage in a pass band and a power roll off greater than 20 dB per decade.
6. The filter of claim 1, wherein the output voltage is taken across the resistor, such that the filter is a passive high-pass filter with the output voltage greater than the input voltage in a pass band and a power roll off greater than 20 dB per decade.
7. The filter of claim 1, wherein the circuit is a resonant circuit, wherein the output voltage is taken across the positive capacitor, and wherein, in a resonant frequency band, the circuit is a passive filter with the output voltage across the positive capacitor greater than the input voltage applied across the circuit.
8. The filter of claim 1, wherein the circuit is an integrated circuit formed on a substrate.
9. The filter of claim 8, wherein the circuit comprises:
a dielectric oxide layer sandwiched between a first metal layer and a layer of the two metal layers, wherein the first metal layer extends beyond the dielectric layer, and wherein the extended portion of the first metal layer is patterned; and.
10. The filter of claim 9, wherein the first metal layer is arranged on the substrate.
11. A filter, comprising:
a circuit including a resistor, a positive capacitor, and a negative capacitor connected in series to accept same current;
an input terminal to accept an input voltage across the circuit; and
an output terminal to deliver an output voltage taken across the resistor or the positive capacitor, wherein the output voltage is taken across the positive capacitor, such that the filter is a passive low-pass filter with the output voltage greater than the input voltage in a pass band and a power roll off greater than 20 dB per decade.
12. A filter, comprising:
a circuit including a resistor, a positive capacitor, and a negative capacitor connected in series to accept same current;
an input terminal to accept an input voltage across the circuit; and
an output terminal to deliver an output voltage taken across the resistor or the positive capacitor, wherein the output voltage is taken across the resistor, such that the filter is a passive high-pass filter with the output voltage greater than the input voltage in a pass band and a power roll off greater than 20 dB per decade.
13. A filter, comprising:
a circuit including a resistor, a positive capacitor, and a negative capacitor connected in series to accept same current;
an input terminal to accept an input voltage across the circuit; and
an output terminal to deliver an output voltage taken across the resistor or the positive capacitor, wherein the circuit is a resonant circuit, wherein the output voltage is taken across the positive capacitor, and wherein, in a resonant frequency band, the circuit is a passive filter with the output voltage across the positive capacitor greater than the input voltage applied across the circuit.
14. A filter, comprising:
a circuit including a resistor, a positive capacitor, and a negative capacitor connected in series to accept same current;
an input terminal to accept an input voltage across the circuit; and
an output terminal to deliver an output voltage taken across the resistor or the positive capacitor, wherein the circuit is an integrated circuit formed on a substrate, the circuit comprises:
a dielectric oxide layer sandwiched between a first metal layer and a second metal layer, wherein the first metal layer extends beyond the dielectric layer, and wherein the extended portion of the first metal layer is patterned; and
a ferroelectric layer sandwiched between the second metal layer and a third metal layer.

15. A filter, comprising:
a circuit including a resistor, a positive capacitor, and a negative capacitor connected in series to accept same current;
an input terminal to accept an input voltage across the circuit; and
an output terminal to deliver an output voltage taken across the resistor or the positive capacitor, wherein the resistor is formed by a transistor operating in a triode region.

* * * * *